(12) United States Patent
Kato

(10) Patent No.: US 6,486,412 B2
(45) Date of Patent: Nov. 26, 2002

(54) WIRING BOARD, METHOD FOR PRODUCING SAME, DISPLAY DEVICE, AND ELECTRONIC DEVICE

(75) Inventor: Hiroki Kato, Matsumoto (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 09/951,341

(22) Filed: Sep. 13, 2001

(65) Prior Publication Data

US 2002/0030978 A1 Mar. 14, 2002

(30) Foreign Application Priority Data

Sep. 13, 2000 (JP) ........................................ 2000-278871
Jul. 12, 2001 (JP) ........................................ 2001-212079

(51) Int. Cl.⁷ ................................................ H05K 1/16
(52) U.S. Cl. ...................... 174/260; 257/776; 361/772; 361/777; 361/783
(58) Field of Search ................................ 174/260, 268, 174/261; 361/777, 783, 772; 29/830; 257/786, 773

(56) References Cited

U.S. PATENT DOCUMENTS 4,495,377 A * 1/1985 Johnson et al. ............. 361/777
4,750,092 A * 6/1988 Werther ...................... 361/783
5,491,364 A * 2/1996 Brandenburg et al. ...... 257/786
5,686,699 A * 11/1997 Chu et al. ................... 361/777

FOREIGN PATENT DOCUMENTS

| JP | 03-048436 | 3/1991 |
|---|---|---|
| JP | 03-244140 | 10/1991 |
| JP | 04-171951 | 6/1992 |
| JP | 06-097208 | 4/1994 |
| JP | 08-335593 | 12/1996 |
| JP | 2000-294896 | 10/2000 |

OTHER PUBLICATIONS

First page of JP 61–156239, dated Sep. 27, 1986 and partial translation thereof.
First page of JP 01–153640, dated Oct. 23, 1989 and partial translation thereof.

* cited by examiner

Primary Examiner—Albert W. Paladini
(74) Attorney, Agent, or Firm—Harness, Dickey & Pierce, P.L.C.

(57) ABSTRACT

In a wiring board having a mounting region on which an integrated circuit having a plurality of terminals is mounted, and having a plurality of substrate-side wiring lines to be connected to the integrated circuit formed thereon, a conductor pattern is formed to extend in a substantially radial form from a prescribed point in the mounting region to reach two or more of the substrate-side wiring lines to be grounded.

22 Claims, 9 Drawing Sheets

WIRING BOARD, METHOD FOR PRODUCING SAME, DISPLAY DEVICE, AND ELECTRONIC DEVICE

BACKGROUND OF THE INVENTION

1. Technical Field of the Invention

The present invention relates to a wiring board, a process for producing the same, a display device, and an electronic device.

2. Conventional Art

In recent years, portable electronic devices such as mobile phones have rapidly become widespread. Electronic devices generally have a wiring board (printed board) having various kinds of IC chips mounted thereon.

There is a strong demand for reducing the weight of portable electronic devices. Various techniques for satisfying these demands have been proposed for various components forming the electronic devices. This also includes the wiring board, and techniques for satisfying the demands for reduced weight are being developed. On the other hand, electronic devices having high performance are also demanded, and therefore it can be said that there are strong demands for developing a technique realizing weight reduction without impairing performance.

The invention has been achieved in view of these circumstances, and an object thereof is to provide a wiring board that can realize weight reduction and a process for producing the same, as well as a display device and an electronic device using the wiring board.

SUMMARY OF THE INVENTION

In order to solve the problems, the wiring board of the invention comprises a base member having a mounting region on which an integrated circuit having a plurality of terminals is mounted, a plurality of wiring lines formed on the base member are connected to the plurality of terminals of the integrated circuit, and a conductor pattern is formed on the mounting region of the base member and is connected to the plurality of wiring lines, and is characterized in that the conductor pattern is maintained at a prescribed potential and has a shape extending in a substantially radial form toward the plurality of wiring lines.

According to the wiring board, the conductor pattern for interconnecting the plurality of wiring lines to be grounded has a shape extending in a radial form inside the mounting region. Therefore, the conductor pattern can be formed with a small amount of material as compared to the case of a conductor pattern covering most of the mounting region (a so-called "solid pattern"), thereby realizing a reduction in weight of the wiring board.

Furthermore, because the conductor pattern is maintained at the prescribed potential, electrical noise generated from the integrated circuit and electrical noise carried from the outside can be attenuated. Therefore, an effect in that the influence of the electrical noise to the components forming the electronic equipment is decreased can also be obtained.

In the case where a conductor pattern is formed to cover most of the mounting region, a problem arises in that the wiring lines and the conductor pattern, which essentially should not be short circuited, are liable to be electrically shorted because the distance between the conductor pattern and the wiring lines becomes small. On the other hand, the conductor pattern of the wiring board according to the invention has a shape extending in a radial form with respect to the wiring lines to be grounded with the prescribed point as the center. Therefore, a distance that is sufficient to prevent short circuiting between the wiring lines not to be grounded and the conductor pattern can be ensured.

In view of the standpoint where the conductor pattern has the shape extending in a substantially radial form from the prescribed point in the mounting region, it is preferred that the prescribed point is positioned in the vicinity of the center of the mounting region. According to this arrangement, in the case where, for example, a structure wherein the plurality of wiring lines are arranged along the outer periphery of the mounting region of a substantial quadrangular shape is employed, a sufficient distance can be ensured between the wiring lines not to be grounded and the conductor pattern, and therefore, short circuiting formed thereby can be more certainly prevented. In the case where the mounting region has a rectangular shape, the plurality of wiring lines may contain one or more wiring lines formed to cut across one side of the mounting region and one or more wirings lines formed to cut across another side adjacent to the one side.

It is also preferred that the integrated circuit is mounted on the mounting region of the base member through an anisotropic conductive film having conductive particles dispersed therein. According to this arrangement, the terminals of the integrated circuit and the wiring lines on the substrate can be connected at the same time as connecting the integrated circuit to the base member, whereby the production process can be simplified, and the production cost can be reduced.

In the case where the integrated circuit is mounted by using the anisotropic conductive film, it is preferred that the mounting region has an area of a region having the conductor pattern formed thereon that is smaller than an area of a region other than that region. According to this arrangement, the region on the mounting region having no conductor pattern formed, i.e., the region with the surface of the base member exposed, can be assured to be relatively wide, and therefore, the following effects can be obtained. That is, in the case where, for example, a conductor pattern formed with a copper thin film having gold plating is formed on a base member formed of polyimide, the adhesion strength to the anisotropic conductive film at the surface of the base member is generally higher than that at the surface of the conductor pattern. Therefore, a conductor pattern of the substantially radial form is employed to form a large area in the mounting region where the base member is exposed, whereby the adhesion strength between the base member and the integrated circuit can be improved.

When a member in a thin plate form that is permeable to moisture is used as the base member, an effect can be obtained in that moisture contained in the anisotropic conductive film can be released to the outside through the base member. When the area in the mounting region with the surface of the base member exposed is ensured to be large, the region that is permeable to moisture can be made larger, and the effect can be more remarkably exhibited.

It is also preferred that a material having flexibility is used as the base member. According to this arrangement, in the case where, for example, the wiring board is used as a display panel, a structure wherein the wiring board can be folded to the back side of the display panel can be employed, and thus miniaturization of the electronic device can be accomplished. The wiring board according to the invention may also have a structure wherein it has a substrate having a mounting region on which an integrated circuit is mounted, and a conductor pattern which is formed on the mounting region and which is grounded, and wherein the conductor pattern has a shape extending in a substantially radial form from a prescribed point in the vicinity of a center of the mounting region.

Furthermore, in order to solve the problems, the invention relates to a display device comprising a display panel having an electro-optical substance held between a first electrode and a second electrode facing each other, and characterized by comprising a base member connected to the display panel, an integrated circuit which has a plurality of terminals and which is mounted on the base member, a plurality of wiring lines formed on the base member, which are connected to the plurality of terminals of the integrated circuit, and a conductor pattern which is formed on the mounting region of the base member on which the integrated circuit is mounted and which is connected to the plurality of wiring lines, wherein the conductor pattern is maintained at a prescribed potential and has a shape extending in a substantially radial form toward the plurality of wiring lines.

As the display panel, a liquid crystal panel containing a liquid crystal may be used as the electro-optical substance, or alternatively, an EL panel using an EL (electro-luminescence) luminescence layer may be used as the electro-optical substance. As the integrated circuit to be mounted on the base member, one having a circuit for generating a voltage to be applied to at least one of the first electrode and the second electrode may be used. Furthermore, the invention can also be practiced in an embodiment of an electronic device using the display device as a display part.

In order to solve the problems, the invention relates to a method for producing a wiring board comprising a base member having an integrated circuit mounted thereon and a plurality of wiring lines which are formed on the base member and which are connected to a plurality of terminals of the integrated circuit, characterized by comprising a step of forming a conductor pattern having a shape extending in a substantially radial form toward the plurality of wiring lines on a mounting region of the base member on which the integrated circuit is mounted, and a step of mounting the integrated circuit on the mounting region. According to a circuit board obtained by this method, the effects similar to the foregoing wiring boards can be obtained.

When this production method is used, it is preferred that the integrated circuit is connected to the base member via an adhesive having conductive particles dispersed therein upon mounting the integrated circuit. More specifically, it is preferred that the integrated circuit is pressed on the base member in a state where the adhesive intervenes between the integrated circuit and the base member. By doing so, the terminals of the integrated circuit and the wiring lines on the base member can be connected at the same time as connecting the integrated circuit to the base member, thereby simplifying the production process, and allowing the production cost to be reduced.

DETAILED DESCRIPTION OF THE PREFERRED EMBODIMENTS

Figure 1:
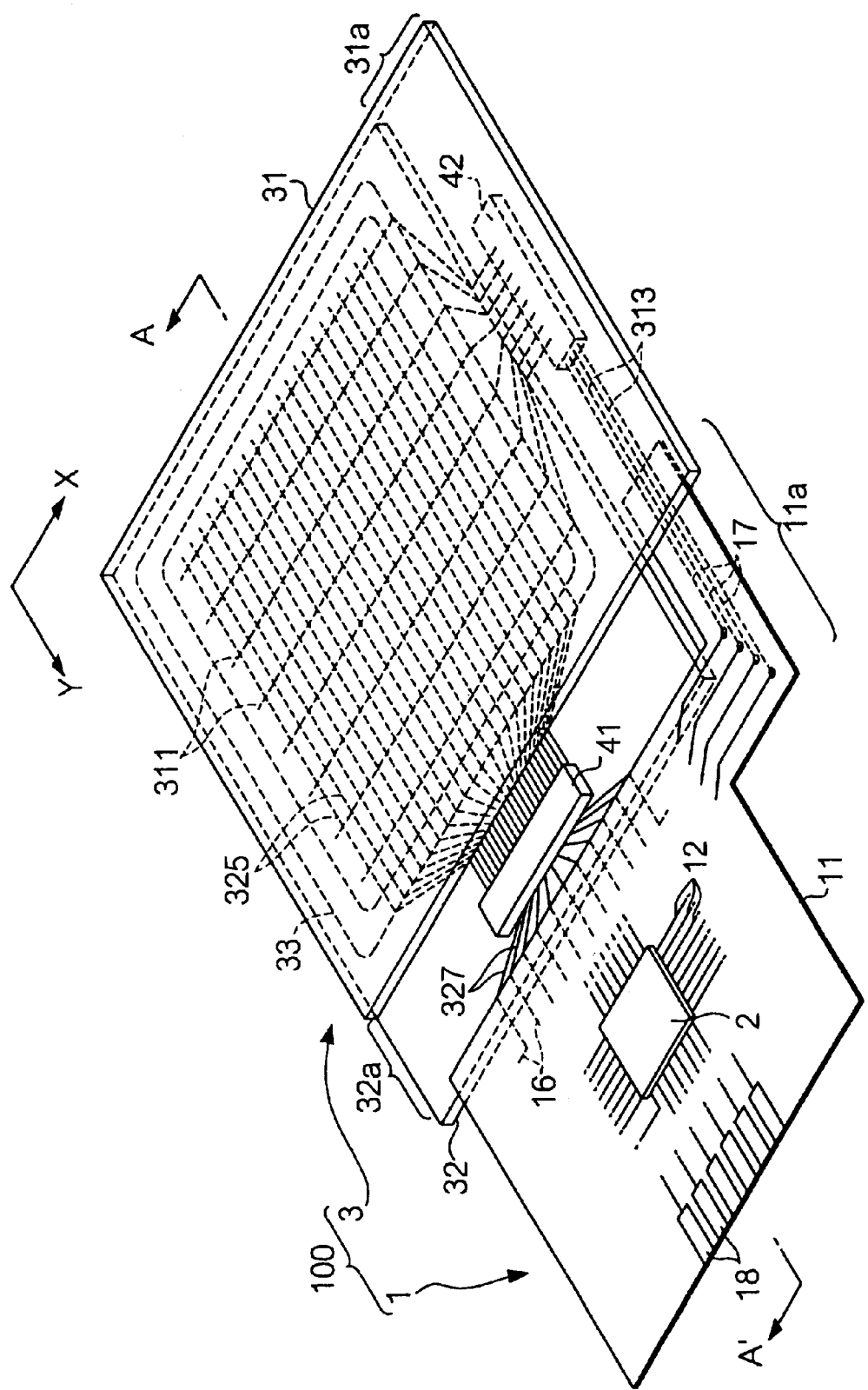
FIG. 1 is a perspective view showing the construction of the liquid crystal device according to the first embodiment of the invention.

Embodiments of the invention will be described below with reference to the drawings. The embodiments only indicate examples of the invention and do not restrict the invention; and they may be arbitrarily modified within the scope of the invention. In the drawings shown below, the scale is changed for each layer and each member, whereby the respective layers and the respective members have sizes which enable them to be easily recognized on the drawings.

Figure 2:
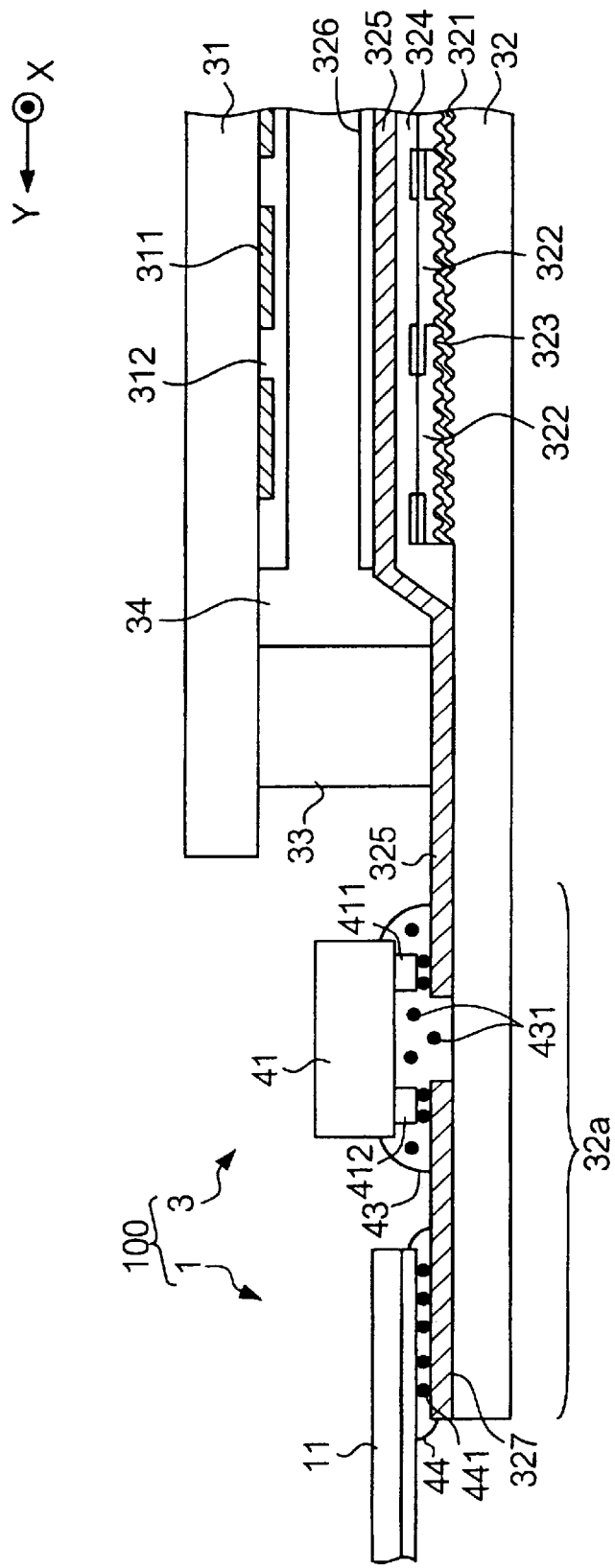
FIG. 2 is a view showing a partial cross-section along line A–A' in FIG. 1.

A first embodiment in which the invention is applied to a reflective passive-matrix liquid crystal device will be described. FIG. 1 is a perspective view showing the appearance of the liquid crystal, and FIG. 2 is a view showing a partial cross-section through line A–A' in FIG. 1. As shown in these figures, a liquid crystal device 100 has a liquid crystal panel 3 and a flexible wiring board 1. Although, in practice, the flexible wiring board 1 is folded to the back of the liquid crystal panel 3 in the liquid crystal device, for convenience of explanation, FIGS. 1 and 2 show the state before the flexible wiring board 1 is folded.

As shown in these figures, the liquid crystal panel 3 has a structure such that a first substrate 31 and a second substrate 32 facing each other are bonded by a sealing material 33, and a liquid crystal 34, for example, of a TN (twisted nematic) type, is filled between the substrates.

The first substrate 31 and the second substrate 32 are transmissive plate members, such as glass, quartz and plastic. On the inner surface (on the liquid crystal 34 side) of the first substrate 31 positioned on the viewing side, a plurality of common (scanning) electrodes 311 extending in the X-axis direction are formed. The common electrodes 311 are strip electrodes formed of a transparent conductive material, such as ITO (indium tin oxide). In FIG. 1, the common electrodes 311 and segment electrodes 325 (described later) are shown by simple straight lines for preventing complication of the figure. The surface of the first substrate 31 having the common electrodes 311 formed thereon is covered with an orientation film 312. The orientation film 312 is an organic thin film formed of polyimide or the like which has been subjected to a rubbing treatment to determine the orientation direction of the liquid crystal 34 when no voltage is applied. In practice, a polarizing plate for polarizing the incident light, a phase-contrast plate for compensating for interference colors, and the like are appropriately bonded on the outer surface (opposite to the liquid crystal 34) of the first substrate 31, but illustration and description thereof are omitted.

On the other hand, a reflective layer 321 is formed on the inner surface of the second substrate 32. The reflective layer 321 is a layer for reflecting light incident from the viewing side with respect to the liquid crystal panel 3 (sunlight, interior illumination, and the like). The reflective layer 321 is formed of a reflective metal, such as aluminum, silver, and the like, or an alloy containing that metal as a main component. As shown in FIG. 2, the region of the inner surface of the second substrate 32 that is covered with the reflective layer 321 is a roughened surface on which a large numbers of fine protrusions and depressions is formed. Therefore, the surface of the reflective layer 321 becomes a roughened surface reflecting the protrusions and depressions on the surface of the second substrate 32. As a result, the incident light from the observation side is reflected in an appropriately scattered state at the surface of the reflective layer 321, and thus specular reflection at the reflective layer 321 is avoided to realize a wide viewing angle.

Furthermore, a color filter 322, a light shielding layer 323, an overcoat layer 324, the plurality of segment electrodes 325 and an orientation film 326 are formed on the reflective layer 321. The overcoat layer 324 is a resin layer for flattening steps formed by the color filter 322 and the light shielding layer 323. The segment electrodes 325 are strip electrodes formed on the overcoat layer 324 and extend in the direction perpendicular to the extending direction of the common electrodes 311 (i.e., the Y-axis direction shown in FIG. 1). The segment electrodes 325 are formed of a transparent conductive material, such as ITO, similarly to the common electrodes 311. By this arrangement, the orientation direction of the liquid crystal 34 changes corresponding to the voltage applied between the common electrodes 311 and the segment electrodes 325. In other words, the regions where the common electrodes 311 cross the segment electrodes 325 function as subpixels. The color filter 322 is a resin layer provided corresponding to the subpixels and is colored with a dye or a pigment of one color of R (red), G (green) and B (blue). A pixel (dot) of the displayed image is composed of three subpixels corresponding to the R, G and B color filters 322. On the other hand, the light shielding layer 323 is formed in a lattice corresponding to gaps among the subpixels, so as to shield the gaps among the subpixels from light. The light shielding layer 323 in this embodiment is formed by combining the color filters 322 of the three colors, R, G and B.

As shown in FIG. 1, the second substrate 32 has a region 32a extending past the edge of the first substrate 31 in the positive direction of the Y axis (i.e., a region that does not face the first substrate 31 and which is referred to as "margin region" hereinafter). The segment electrodes 325 are formed to extend from the region surrounded by the sealing material 33 to the margin region 32a, and are connected to respective output terminals of a driving IC chip 41 COG (chip on glass)mounted on the margin region 32a. That is, as shown in FIG. 2, ends of the segment electrodes 325 reaching the margin region 32a and the output terminals 411 of the driving IC chip 41 are electrically connected via conductive particles 431 in an anisotropic conductive film 43. Furthermore, on the margin region 32a, a plurality of panel terminals 327 are formed extending from the region where the driving IC chip 41 is mounted to the periphery of the second substrate 32. The panel terminals 327 are connected to respective input terminals 412 of the driving IC chip 41 through the conductive particles 431 in the anisotropic conductive film 43, as shown in FIG. 2.

On the other hand, as shown in FIG. 1, the first substrate 31 has a margin region 31a extending past the edge of the second substrate 32 in the positive direction of the X axis. The common electrodes 311 extend from the region surrounded by the sealing material 33 to the margin region 31a and are connected to respective output terminals of a driving IC chip 42 COG mounted on the margin region 31a. Furthermore, on the margin region 31a, a plurality of panel terminals 313 are formed to connect to input terminals of the driving IC chip 42.

The structure of the flexible wiring board 1 will be described. As shown in FIGS. 1 and 2, the flexible wiring board 1 has a base member 11. The base member 11 is a member in the form of thin plate (film) formed, for example, of polyimide, polyethylene terephthalate, polyester or the like, and is flexibile. As shown in FIG. 1, part in the vicinity of the periphery of the base member 11 is connected to the marginal region 32a of the second substrate 32. On the other hand, the vicinity of the end of a part 11a of the base member 11 protruding toward the marginal region 31a of the first substrate 31 is connected to the marginal region 31a.

Various wiring lines are formed on both surfaces of the base member 11. These wiring lines are formed, for example, in such a manner that a copper thin film formed by sputtering on the base member 11 is patterned by photolithography or etching, followed by gold plating formed on the surface thereof.

Among the wiring lines, wiring lines 16 shown in FIG. 1 have one end positioned in a region that is to be connected to the marginal region 32a of the base member 11. As shown in FIG. 2, the wiring lines 16 are connected to the panel terminals 327 on the marginal region 32a via the conductive particles 441 dispersed in the anisotropic conductive film 44 in a state where the base member 11 and the second substrate 32 are connected via the anisotropic conductive film 44. On the other hand, wiring lines 17 shown in FIG. 1 have one end positioned in the vicinity of the end of the protruding part 11a of the base member 11. The wiring lines 17 are also connected, similarly to the wiring lines 16, to the panel terminals 313 on the marginal region 31a in a state where the end of the protruding part 11a and the marginal region 31a of the first substrate 31 are connected via the anisotropic conductive film. External connection terminals 18 are formed in the vicinity of the end of the base member 11 opposite to the end connected to the liquid crystal panel 3. The external connection terminals 18 are terminals to be connected to external equipment that issues instructions relating to displayed images to the liquid crystal device 100.

An IC chip 2 is mounted on the surface of the base member 11. The IC chip 2 has a circuit (such as a booster circuit) for generating a voltage to be applied to the common electrodes 311 and the segment electrodes 325. That is, the driving IC chip 41 supplies a voltage to the common electrodes 311 corresponding to the signal supplied through the flexible wiring board 1. Similarly, the driving IC chip 42 supplies a voltage to the segment electrodes 325 corresponding to the signal supplied through the flexible wiring board 1. While various kinds of electronic parts such as chip capacitors and resistors are mounted on the base member 11 in addition to the IC chip 2, illustrations thereof are omitted.

Figure 3:
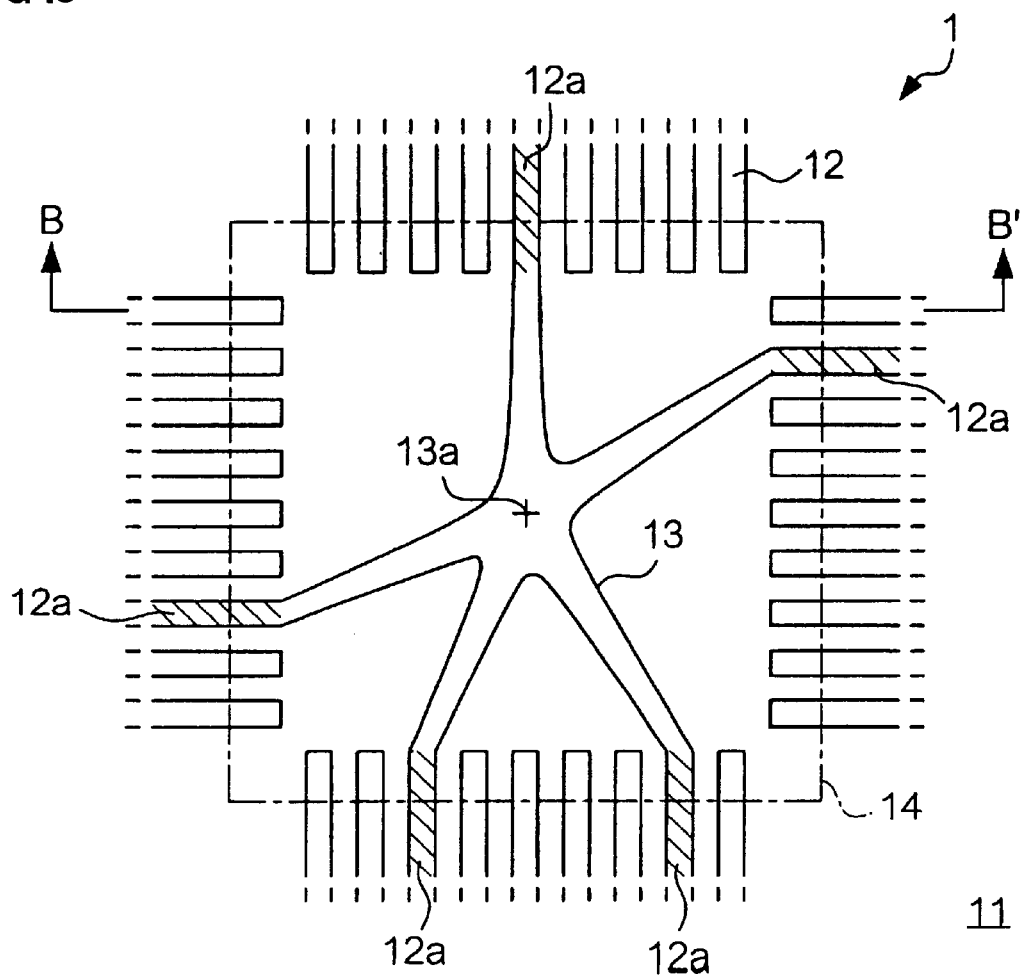
FIG. 3 is an enlarged plan view showing part of the flexible wiring board in the liquid crystal equipment.
Figure 4:
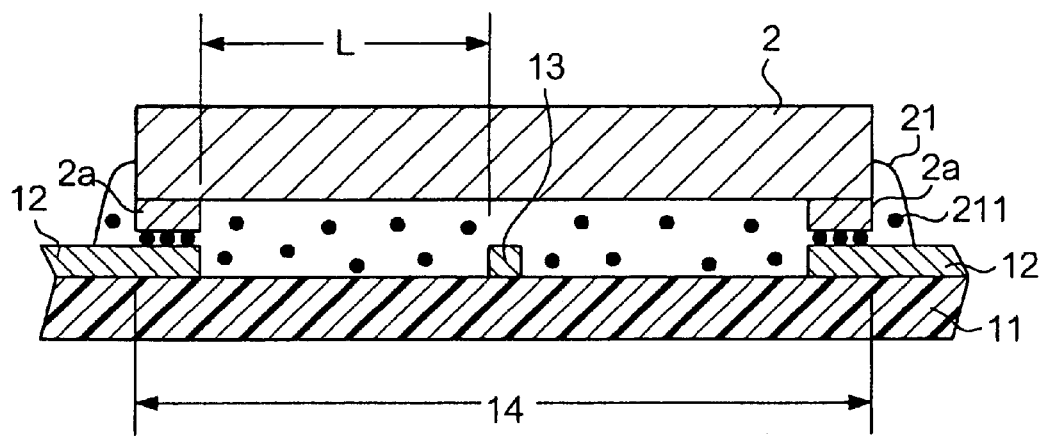
FIG. 4 is a cross-sectional view along line B–B' in FIG. 3.

FIG. 3 is a plan view schematically showing the structure of the region of the base member 11 where the IC chip 2 is mounted and the vicinity thereof, and FIG. 4 is a cross sectional view along line B–B' in FIG. 3. In FIG. 3, the outline of the IC chip 2 to be mounted on the base member 11 is shown by a single chain line so as not to complicate the figure. In the following, the region of the base member 11 where the IC chip 2 is to be mounted, i.e., the region surrounded by the single chain line in FIG. 3, is referred to as a "mounting region 14".

As shown in these figures, a plurality of substrate-side wiring lines 12 and a conductor pattern 13 are formed in the vicinity of the mounting region 14 of the base member 11. The respective substrate-side wiring lines 12 are formed to extend from the outside of the mounting region 14 to the vicinity of the edges of the mounting region 14 with one end thereof reaching the inside of the mounting region 14. The substrate-side wiring lines 12 are electrically connected to bump electrodes (bumps) 2a formed on the terminals of the IC chip 2. That is, the IC chip 2 is pressed on the base member 11 in a state where an anisotropic conductive film 21 intervenes between the IC chip 2 and the base member 11, so as to connect the IC chip 2 and the base member 11, whereby the bump electrodes 2a of the IC chip 2 and the substrate-side wiring lines 12 are conductively connected via the conductive particles 211 in the anisotropic conductive film 21.

In FIG. 3, among the plurality of substrate-side wiring lines 12, five substrate-side wiring lines 12 grounded to the low potential side of the power source (hereinafter referred to as "ground electrodes 12a") are shown with hatching. A conductor pattern 13 for electrically connecting the plurality of ground electrodes 12a is formed inside the mounting region 14 of the base member 11. The conductor pattern 13 is formed in the same step as the other wiring lines on the base member 11. Therefore, the conductor pattern 13 is a copper thin film having gold plating on the surface thereof.

More specifically, the conductor pattern 13 has a substantial radial form extending from one point 13a positioned in the vicinity of the center of the mounting region 14 (hereinafter referred to as a "pattern center point") toward the plurality of ground electrodes 12a, with the ends thereof being connected to the ground electrodes 12a. Furthermore, as is clear from FIG. 3, the area of the region having the conductor pattern 13 formed thereon on the mounting region 14 is smaller than the area of the other region (i.e., the region not covered with the conductor pattern 13). Owing to the conductor pattern 13 having such a shape formed inside the mounting region 14, the following effects can be obtained.

Figure 5:
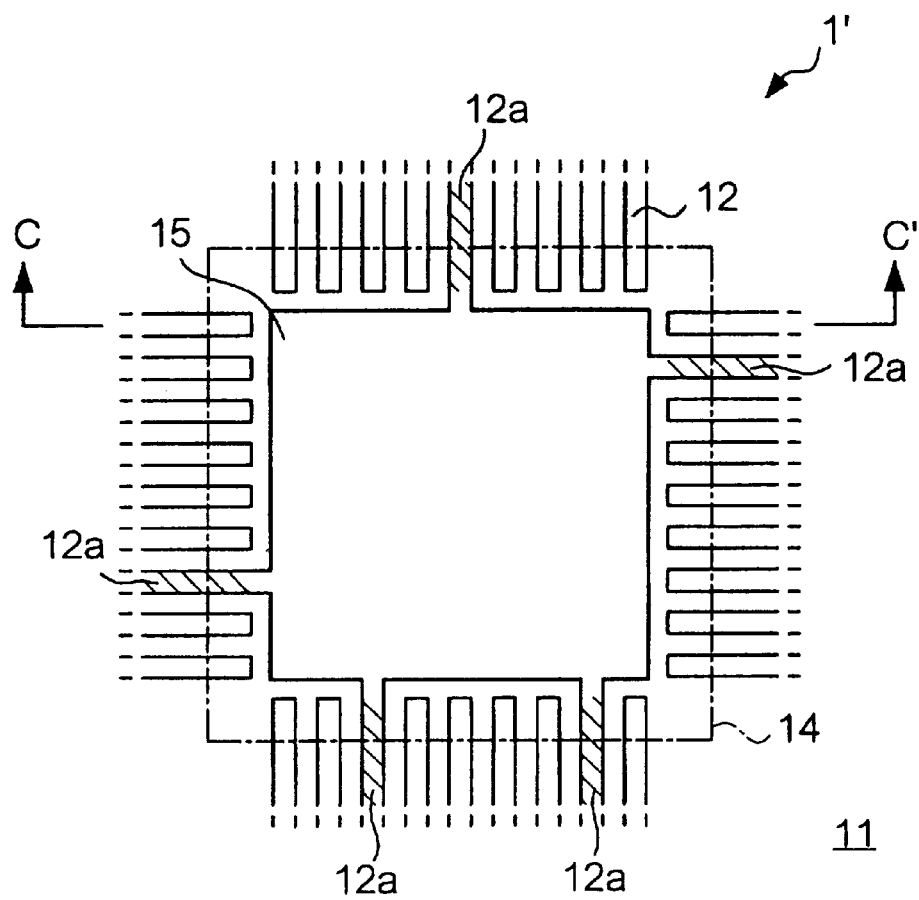
FIG. 5 is a plan view showing the construction of the comparative example for showing the effect obtained by the flexible wiring board.
Figure 6:
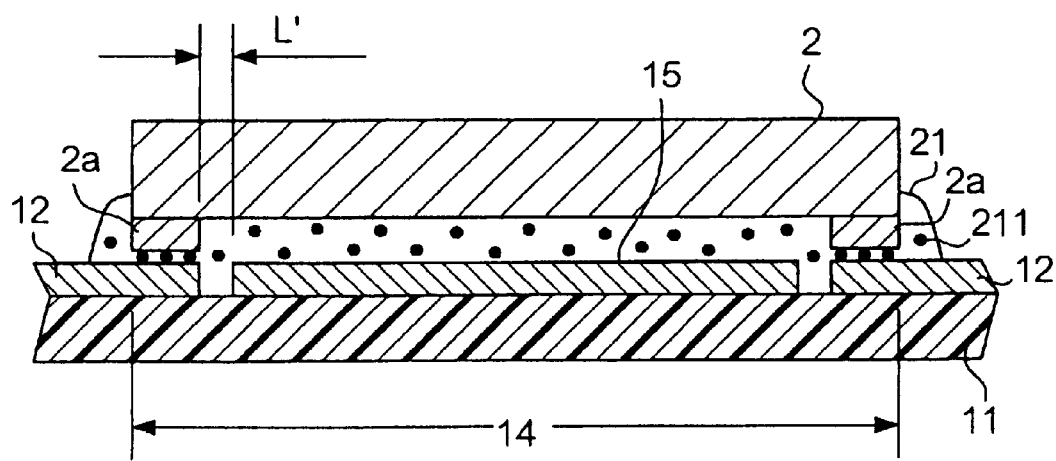
FIG. 6 is a cross-sectional view along line C–C' in FIG. 5.

As a conductor pattern for mutually connecting each of the ground electrodes 12a, the shape shown in FIGS. 5 and 6 can be considered. That is, a quadrangular conductor pattern 15 is formed to cover most of the mounting region 14, and the conductor pattern 15 is connected to the ground electrodes 12a. In FIGS. 5 and 6, the same symbols are attached to the elements that are common to FIGS. 3 and 4.

However, in the case where that configuration is employed, it is necessary upon forming the conductive pattern 15 that a conductive material be formed to cover most of the mounting region 14. On the other hand, in the case where the conductive pattern 13 according to this embodiment is used, it is sufficient that a conductive material is formed only in the region from the one point in the mounting region 14 toward each of the ground electrodes 12a. Therefore, according to the embodiment, an advantage is obtained in that weight reduction of the flexible wiring board 1 is realized in comparison to the case where the conductor pattern 15 shown in FIGS. 5 and 6 is employed.

In the case where the conductor pattern 15 is used, the distance between the substrate-side wiring lines 12 not to be grounded and the conductor pattern 15 (shown by "L'" in FIG. 6) becomes very small. As a result, it may transpire in some cases that the substrate-side wiring lines 12 not to be grounded come into contact with the conductor pattern 15 thereby causing electrical shorting. On the other hand, the conductor pattern 13 according to this embodiment has such a shape that extends from the pattern center point 13a positioned at the center of the mounting region 14 only toward the ground electrodes 12a. Accordingly, as shown in FIG. 4, a relatively large distance (shown by "L"in FIG. 4) can be assured between the substrate-side wiring lines 12 not to be grounded and the conductor pattern 13. Therefore, according to this embodiment, an advantage can be obtained in that short circuiting between the substrate-side wiring lines 12 not to be grounded and the conductor pattern 13 can be avoided in comparison to the case where the conductor pattern 15 having the shape shown in FIGS. 5 and 6 is employed.

In the case where such a construction is employed that the substrate-side wiring lines 12 are arranged along the outer periphery of the mounting region 14, as exemplified in FIG. 3, it is preferred that the position of the pattern center point 13a be in the vicinity of the center of the mounting region 14 in order to ensure a sufficient distance between the conductor pattern 13 and all the substrate-side wiring lines 12 to prevent short circuiting thereof. However, the position of the pattern center point 13a is not limited to that position. That is, irrespective of whether the pattern center point 13a is positioned in the vicinity of the center of the mounting region 14, the desired effect of the invention, i.e., weight reduction of the wiring board, can be obtained when the conductor pattern 13 has a substantially radial form with the pattern center point 13a as a center.

Meanwhile, electric noise associated with the operation of the IC chip 2 and electrical noise carried from the outside to the electronic equipment may affect the elements (such as an IC chip, a communication antenna in portable communication equipments) forming the electronic device. As described in the foregoing, since the conductor pattern 13 according to the embodiment is maintained at a low potential, an effect can be exhibited in that the electrical noise is attenuated to reduce the influence on the other elements (shielding effect). Upon comparing the conductor pattern 13 according to the embodiment and the conductor pattern 15 shown in FIGS. 5 and 6, because the latter has a large proportion of the area occupied on the mounting region 14, it may be considered that the shielding effect thus exhibited is large. However, according to tests conducted by the inventors, such findings have been obtained that in the case where the area of the mounting region 14 is relatively small, there is no large difference in the level of the shielding effect therebetween. In other words, according to the embodiment, weight reduction can be achieved without impairing the performance that should be maintained.

Figure 7:
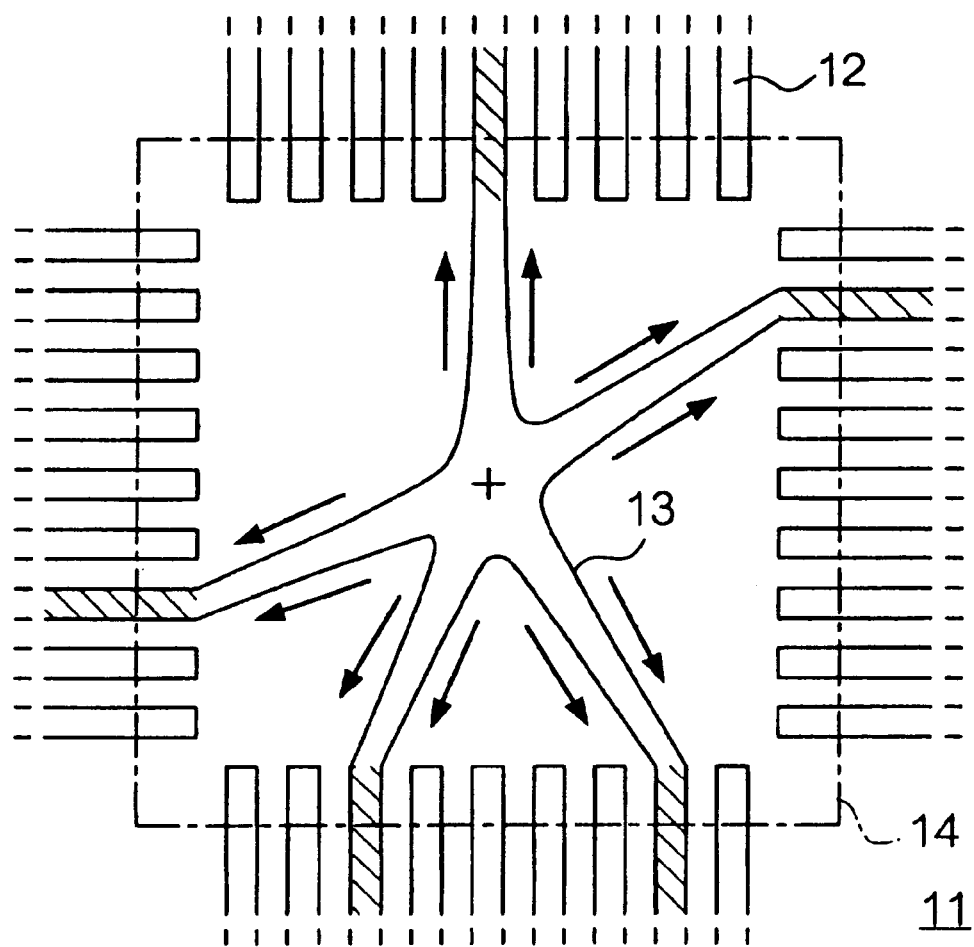
FIG. 7 is a view showing the effect of the embodiment.

Upon mounting the IC chip 2 on the base member 11, when they are pressed through the anisotropic conductive film 21 intervening therebetween, there are some cases where bubbles intrude between the base member 11 and the anisotropic conductive film 21. When the bubbles remain between the IC chip 2 and the base member 11, the adhesion thereof becomes insufficient resulting in the problem that the IC chip 2 is liable to be released from the base member 11. However, according to the embodiment, because the conductor pattern 13 extending in a substantially radial form is formed in the region of the base member 11 that is in contact with the anisotropic conductive film 21, an advantage is obtained in that migration of the bubbles is accelerated. That is, as shown by the arrows in FIG. 7, bubbles formed on the mounting region 14 migrate along the conductor pattern 13 extending in a radial form toward the outside of the mounting region 14, and thus the bubbles remaining in the region can be suppressed.

Meanwhile, in the case where the IC chip 2 is pressed on the base member 11 through the anisotropic conductive film 21, excess adhesive contained in the anisotropic conductive film 21 is extruded to the outside of the mounting region 14. Since the embodiment employs such a constitution that the pattern center point 13a is positioned in the vicinity of the center of the mounting region 14, the excess adhesive is uniformly extruded (in all directions) throughout most of the outer periphery of the mounting region 14. That is, according to the embodiment, the phenomenon in which the excess adhesive is nonuniformly extruded only in the vicinity of part of the outer periphery of the mounting region 14 can be avoided.

Furthermore, since the conductor pattern 13 has the shape of a substantially radial form in this embodiment, a large area of the region of the mounting region 14 that is not covered with the conductor pattern 13 (i.e., the region where the base member 11 is exposed) can be ensured as compared with the case employing the conductor pattern 15 shown in FIG. and 6. Therefore, the following effects can be obtained.

That is, the adhesion strength of the surface of the base member 11 formed with polyimide to the anisotropic conductive film 21 is generally larger than that of the surface of the conductor pattern 13 formed with a copper thin film having gold plating thereon. Therefore, when the conductor pattern 13 of a substantially radial form is employed to ensure a large area of the part of the mounting region 14 where the base member 11 is exposed, an advantage is obtained in that the adhesion strength between the base member 11 and the IC chip 2 is improved. In the case where a material that is water permeable, such as polyimide, is used as the base member 11, moisture contained in the anisotropic conductive film 21 and the like is released to the outside through the base member 11. According to the embodiment, the part of the mounting region 14 where the base member 11 is exposed, i.e., the part that is permeable by moisture, can be ensured to be wide, and thus an advantage is obtained in that the moisture can be effectively released to the outside.

While the case where the wiring board (flexible wiring board) according to the invention is applied to a liquid crystal device is exemplified in the foregoing embodiment, the wiring board can also be applied to other display devices and various kinds of electronic devices. In the display device according to this embodiment, the wiring board according to the invention is applied to an EL (electro-luminescence) device.

Figure 8:
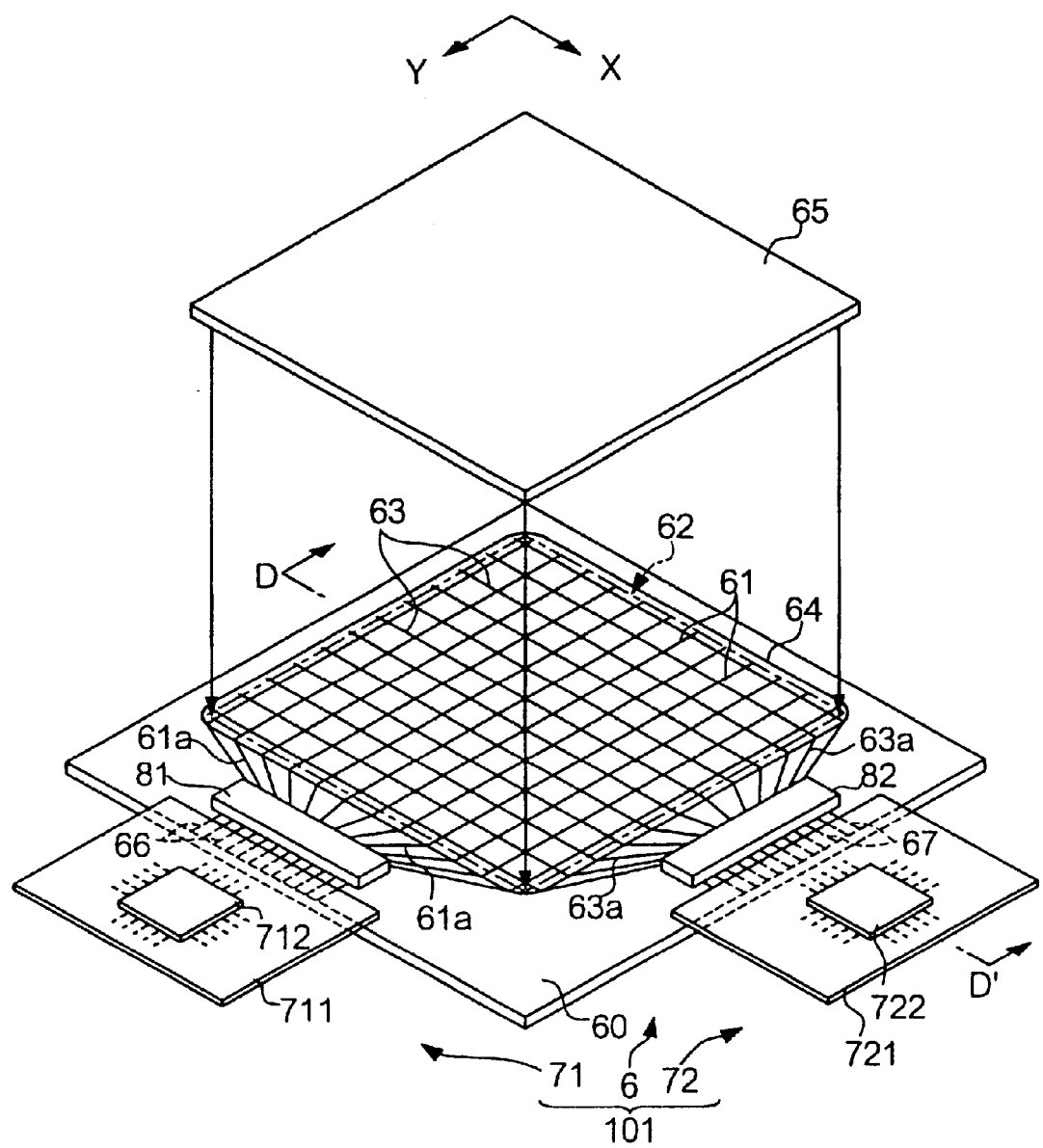
FIG. 8 is a perspective view showing the construction of the EL device according to the second embodiment of the invention.
Figure 9:
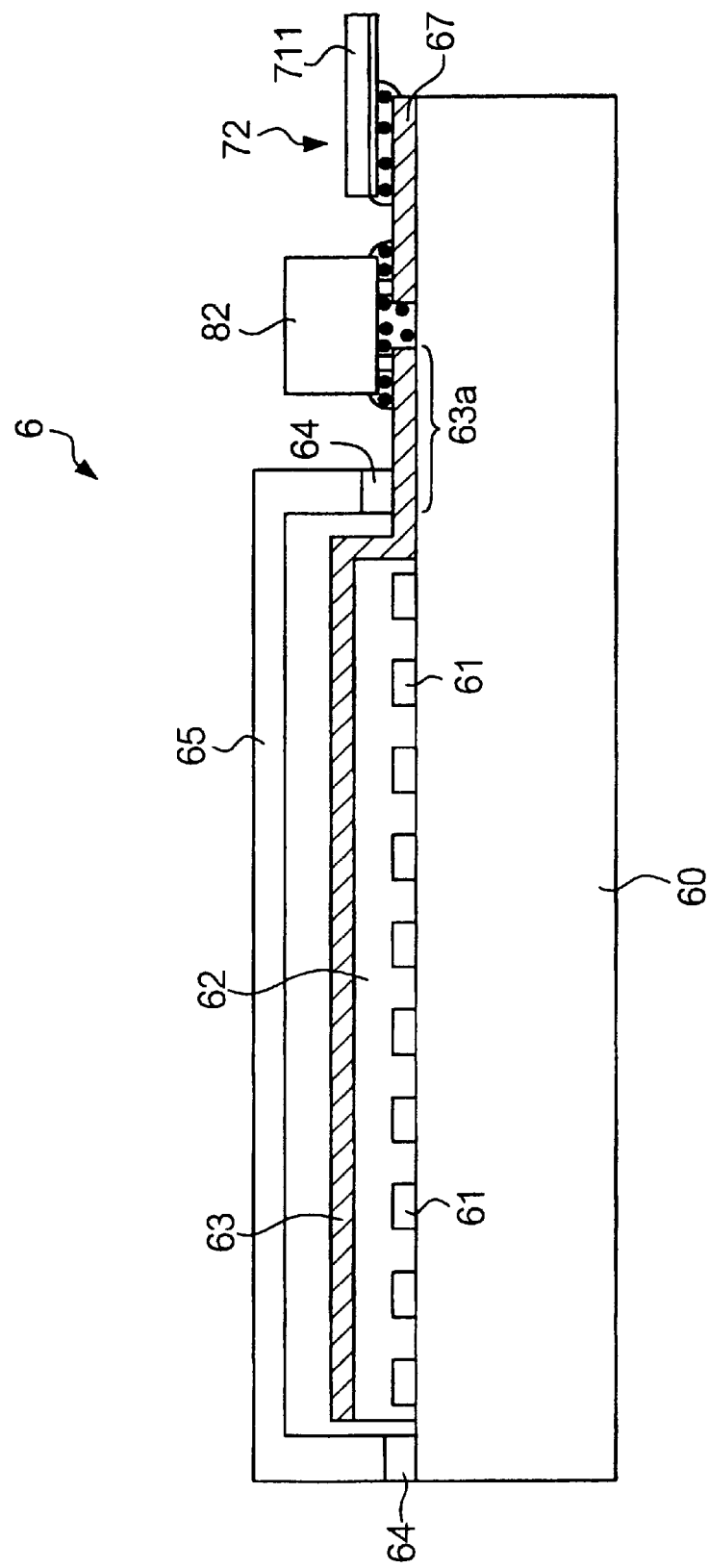
FIG. 9 is a view showing a partial cross-section along line D–D' in FIG. 8.

FIG. 8 is a perspective view showing the appearance of an EL device according to the embodiment, and FIG. 9 is a cross-sectional view along line D–D' in FIG. 8. As shown in these figures, an EL device 101 has an EL panel 6, and a first wiring board 71 and a second wiring board 72 both connected to the EL panel 6. The first wiring board 71 and the second wiring board 72 each has a flexible substrate on which wiring lines are formed.

The EL panel 6 has a transmissive substrate 60, such as glass, quartz, and plastic. A plurality of first electrodes 61 is formed on the surface of the substrate board 60. Each of the first electrodes 61 is a strip electrode extending in the Y-axis direction in the figures, and is formed of a transparent conductive material, such as ITO. On the surface of the substrate 60 on which the first electrodes 61 are formed, an EL luminescence layer 62 having a uniform thickness is deposited. Furthermore, a plurality of second electrodes 63 is formed on the surface of the EL luminescence layer 62 opposite to the first electrodes 61. Each of the second electrodes 63 is a strip electrode extending in the direction perpendicular to the first electrodes 61 (i.e., in the X-axis direction in the figures). The second electrodes 63 are formed with a simple metal, such as aluminum, silver and the like, or an alloy containing that metal as a main component, and have reflectivity. Furthermore, a circular sealing material 64 is formed on the surface of the substrate 60 to surround the EL luminescence layer 62, and a cover 65 is adhered thereto by the sealing material 64.

As shown in FIG. 8, driving IC chips 81 and 82 are mounted on the region on the surface of the substrate 60 outside the sealing material 64 via an anisotropic conductive film. That is, as shown in FIG. 9, the second electrodes 63 reach the outside of the sealing material 64 across the seal material 64, and ends 63a thereof are connected to output terminals of the driving IC chip 82. Similarly, the first electrodes 61 extend to reach the outside of the sealing material 64, and ends 61a thereof are connected to output terminals of the driving IC chip 81.

Panel terminals 66 and 67 are formed in the vicinity of the outer periphery of the substrate 60. Among these, the panel terminals 66 are connected to input terminals of the driving IC chip 81. On the other hand, the panel terminals 67 are connected to input terminals of the driving IC chip 82. The first wiring board 71 and the second wiring board 72 are respectively connected to the vicinities of the outer periphery of the substrate 60 on which the panel terminals 66 and 67 are formed via the anisotropic conductive film. According to this configuration, the wiring lines formed on a substrate 711 of the first wiring board 71 are electrically connected to the panel terminals 66, and the wiring lines formed on a substrate 721 of the second wiring board 72 are electrically connected to the panel terminals 67. By such a construction, the driving IC chips 81 and 82 are driven by signals supplied from an external circuit (not shown in the figures) through the wiring boards 71 and 72. As a result, a prescribed voltage is applied between the first electrodes 61 and the second electrodes 63, so as to emit light from the EL luminescence layer 62 intervening between the electrodes. At this time, the second electrodes 63 also function as a reflective layer.

An IC chip 712 for generating a voltage to be applied to the first electrodes 61 is mounted on the substrate 711 of the first wiring board 71. Similarly, an IC chip 722 for generating a voltage to be applied to the second electrodes 63 is mounted on the substrate 721 of the flexible wiring board 72. The mounting regions of the IC chips 712 and 722 on the substrates 711 and 721 have the constructions shown in FIG. 3 and FIG. 4 described above. That is, the substrates 711 and 721 have formed thereon substrate-side wiring lines to be connected to the terminals of the IC chips 712 and 722, and a conductor pattern having a shape extending in a substantially radial form from a prescribed point in the mounting region 14 toward two or more substrate-side wiring lines. Therefore, this embodiment also enjoys effects similar to the first embodiment.

While the embodiments of the invention have been described hereinabove, the embodiments are only examples, and various modifications can be made to the embodiments within a scope that does not deviate from the gist of the invention. For example, the following modified examples can be considered.

While the flexible wiring boards having flexible substrates have been exemplified in the foregoing embodiments, "substrates" in the invention may not necessarily be those having flexibility. That is, a plate member constituted, for example, of a phenol resin or a glass epoxy resin can be used as the substrate. However, a construction wherein the wiring board is folded to the back side of the display panel can be employed in the case where a flexible substrate is used, and thus the advantage of miniaturization of the display device can be achieved.

While a construction wherein the conductor pattern 13 is connected to the ground electrodes 12a is employed in the foregoing embodiments, it may not necessarily be connected to the ground electrodes 12a. That is, for example, a construction wherein a conductor pattern having a shape extending in a substantially radial form is formed inside the mounting region 14 and is grounded, but the conductor pattern is not connected to the ground electrodes 12a, may be used. In this case, an effect is obtained in that migration of bubbles can be accelerated upon mounting the IC chip 2 on the base member 11 via the anisotropic conductive film.

While a reflective passive-matrix liquid crystal device has been exemplified in the first embodiment, the liquid crystal devices to which the invention can be applied are not limited thereto. That is, the invention can be applied to an active-matrix liquid crystal device having two-terminal switching elements such as TFDs (thin film diodes) or three-terminal switching elements such as TFTs (thin film transistors). The invention can also be applied to a transmission-type liquid crystal device having no reflective layer 321 and a so-called semi-transmissive reflective-type liquid crystal device that can achieve both reflective display and transmissive display. Similarly, while the passive-matrix EL device is exemplified in the second embodiment, the invention can be applied to EL devices having other constructions, such as an active-matrix EL device. Furthermore, the devices to which the invention can be applied are not limited to liquid crystal devices having a liquid crystal panel and EL devices having an EL panel. That is, the invention can be similarly applied to other display devices having various kinds of display panels, such as a PDP (plasma display panel) and an FED (field emission display).

Electronic devices using display devices according to the invention will be described below.

Figure 10:
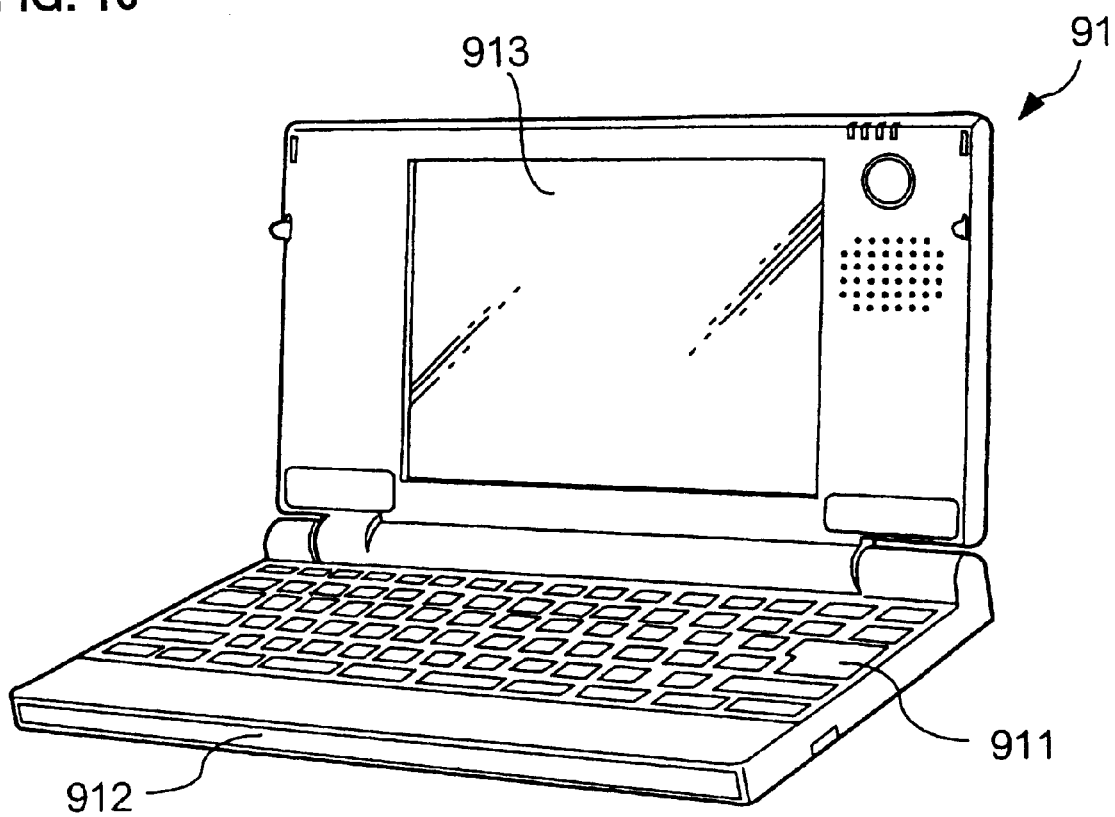
FIG. 10 is a perspective view showing the construction of the personal computer as one example of an electronic device to which the display device according to the invention is applied.

An example where a display device according to the invention is applied to a display part of a portable personal computer (so-called notebook computer) will be described. FIG. 10 is a perspective view showing the construction of a personal computer. As shown in the figure, a personal computer 91 has a main body 912 having a keyboard 911 and a display part 913 to which the display device according to the invention is applied.

Figure 11:
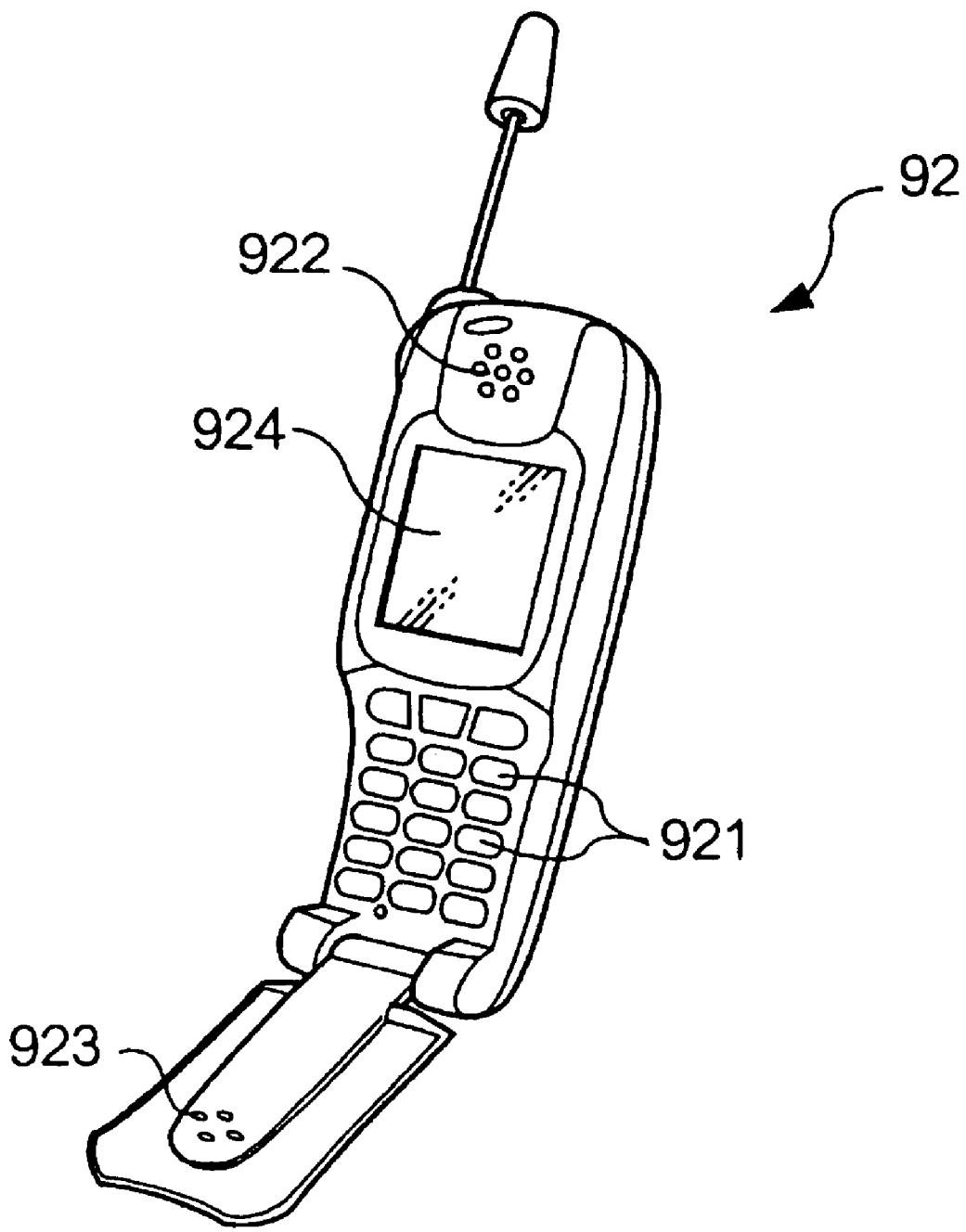
FIG. 11 is a perspective view showing the construction of the portable phone as one example of an electronic device to which the display device according to the invention is applied.

An example where a display device according to the invention is applied to a display part of a mobile phone will be described. FIG. 11 is a perspective view showing the costruction of a mobile phone. As shown in the figure, a portable phone 92 has a display part 924 to which the display device according to the invention is applied, as well as a plurality of operation buttons 921, an earpiece 922, and a mouthpiece 923.

As electronic devices to which the display device according to the invention can be applied, besides the personal computer shown in FIG. 10 and the mobile phone shown in FIG. 11, a liquid crystal television set, a viewfinder-type or a direct-view monitor-type video tape recorder, car navigation equipment, a pager, an electronic notebook, an electronic calculator, a word processor, a workstation, a video phone, a POS terminal, a digital still camera, and a projector using a display device according to the invention as a light valve are also possible.

As described in the foregoing, weight reduction of wiring boards can be realized by the invention. The entire disclosures of Japanese patent application nos. 2000-278871 filed Sep. 13, 2000 and 2001-212079 filed Jul. 12, 2001 are incorporated by reference herein.

What is claimed is:

1. A wiring board comprising:
   a base member including a film member permeable to moisture having a mounting region where an integrated circuit is mounted, said integrated circuit having a plurality of terminals;
   a surface of said integrated circuit where said plurality of terminals are formed;
   a plurality of wiring lines formed on said base member so as to extend from outside the mounting region to within a perimeter of said mounting region;
   a conductor pattern formed inside said mounting region of said base member, facing said surface of said integrated circuit, and having a shape extending in a substantially radial form toward said plurality of wiring lines;
   an anisotropic conductive film disposed between said base member and said surface of said integrated circuit, located in at least said mounting region; and
   a plurality of conductive particles dispersed in said anisotropic conductive film, electrically connecting said plurality of terminals and said plurality of wring lines.

2. A wiring board as described in claim 1 further comprising a power source electrically connected to at least one of said wiring lines via at least one of said terminals, wherein at least one of said wiring lines is electrically connected to said conductor pattern, and wherein said power source supplies said conductor pattern with a ground potential.

3. A wiring board as described in claim 1,
   wherein said conductor pattern extends in said substantially radial form from a prescribed point in said mounting region, and
   said prescribed point is positioned proximate a center of said mounting region.

4. A wiring board as described in claim 1,
   wherein one end of said wiring lines is connected to said terminals of said integrated circuit.

5. A wiring board as described in claim 1,
   wherein said mounting region is substantially rectangular, and
   wherein said plurality of wiring lines comprises one or more wiring lines formed to cut across one side of said mounting region and one or more wiring lines formed to cut across another side of said mounting region adjacent to said one side.

6. A wiring board as described in claim 1,
   wherein said integrated circuit is mounted on said mounting region via an anisotropic conductive film having conductive particles dispersed therein.

7. A wiring board as described in claim 1,
   wherein an area of said mounting region having said conductor pattern formed thereon is smaller than a remaining area of said mounting region.

8. A wiring board as described in claim 1,
   wherein said base member contains polyimide, and
   said conductor pattern contains a layer comprising copper.

9. A wiring board as described in claim 1,
   wherein said base member has flexibility.

10. A wiring board as described in claim 1 further comprising a plurality of connecting terminals formed in a vicinity of a periphery of said base member, wherein said connecting terminals are connected to a plurality of terminals of a display panel.

11. A wiring board comprising:
a base member including a film member permeable to moisture, having a mounting region where an integrated circuit is mounted; said integrated circuit having a surface where a plurality of terminals are formed;
a plurality of wiring lines formed on said base member;
a conductor pattern formed inside said mounting region facing said surface of said integrated circuit, and having a shape extending in a substantially radial form from a prescribed point proximate a center of said mounting region;
an anisotropic conductive film disposed between said base member and said surface of said integrated circuit, located in at least said mounting region; and
a plurality of conductive particles dispersed in said anisotropic conductive film, electrically connecting said plurality of terminals and said plurality of wring lines.

12. A display device comprising:
a display panel having an electro-optical substance held between a first electrode and a second electrode facing each other;
a base member connected to said display panel;
an integrated circuit which has a plurality of terminals, and which is mounted on a mounting region of said base member;
a surface of said integrated circuit, where said plurality of terminals are formed;
a plurality of wiring lines formed on said base member; and
a conductor pattern formed inside said mounting region of said base member where said integrated circuit is mounted, facing said surface of said integrated circuit, electrically connected to said plurality of wiring lines and having a shape extending in a substantially radial form toward said plurality of wiring lines;
an anisotropic conductive film disposed between said base member and said surface of said integrated circuit, located in at least said mounting region; and
a plurality of conductive particles dispersed in said anisotropic conductive film, electrically connecting said plurality of terminals and said plurality of wring lines.

13. A display device as described in claim 12,
wherein said conductor pattern has a shape extending in a substantially radial form from a prescribed point in said mounting region; and
said prescribed point is positioned proximate a center of said mounting region.

14. A display device as described in claim 12,
wherein said electro-optical substance contains a liquid crystal.

15. A display device as described in claim 12,
wherein said electro-optical substance contains an EL luminescence layer.

16. A display device as described in claim 12,
wherein said integrated circuit comprises a circuit generating a potential supplied to at least one of said first electrode and said second electrode.

17. An electronic device comprising a display device according to claim 12 as a display part.

18. A display device comprising:
a display panel having an electro-optical substance held between a first electrode and a second electrode facing each other;
a driving IC electrically connected to said display panel and which is provided on said display panel;
a base member connected to said display panel;
an integrated circuit which has a plurality of terminals and which is mounted on a mounting region of said base member and which is electrically connected to said driving IC;
a surface of said integrated circuit, where said plurality of terminals are formed;
a plurality of wiring lines formed on said base member;
a conductor pattern formed inside said mounting region of said base member on which said integrated circuit is mounted, facing said surface of said integrated circuit, electrically connected to said plurality of wiring lines and having a shape extending in a substantially radial form toward said plurality of wiring lines;
an anisotropic conductive film disposed between said base member and said surface of said integrated circuit, located in at least said mounting region; and
a plurality of conductive particles dispersed in said anisotropic conductive film, electrically connecting said plurality of terminals and said plurality of wring lines.

19. A display device according to claim 18 further comprising a pair of substrates facing each other,
wherein said electrodes are formed on said respective substrates, and wherein said electro-optical substance is a liquid crystal.

20. A method for producing a wiring board including a base member having an integrated circuit mounted on a mounting region and a plurality of wiring lines which are formed on said base member and which are connected to a plurality of terminals of said integrated circuit, the method comprising:
a step of forming a conductor pattern having a shape extending in a substantially radial form toward said plurality of wiring lines on said mounting region of said base member on which said integrated circuit is mounted, and
a step of mounting said integrated circuit on said mounting region.

21. A method for producing a wiring board as described in claim 20 further comprising a step of, upon mounting said integrated circuit, connecting said integrated circuit to said base member via an adhesive having conductive particles dispersed therein.

22. A method for producing a wiring board as described in claim 21 further comprising a step of, upon mounting said integrated circuit, pressing said integrated circuit on said base member in a state where said adhesive intervenes between said integrated circuit and said base member.

* * * * *

UNITED STATES PATENT AND TRADEMARK OFFICE
CERTIFICATE OF CORRECTION

PATENT NO. : 6,486,412 B2
DATED : November 26, 2002
INVENTOR(S) : Hiroki Kato

It is certified that error appears in the above-identified patent and that said Letters Patent is hereby corrected as shown below:

Column 5,
Line 10, "numbers" should be -- number --

Column 9,
Line 20, "FIG. and 6" should be -- Figs. 5 and 6 --

Column 13,
Line 44, "wring" should be -- wiring --

Column 14,
Line 30, "wring" should be -- wiring --

Signed and Sealed this

Twenty-fourth Day of June, 2003

JAMES E. ROGAN
*Director of the United States Patent and Trademark Office*